United States Patent
Maleki et al.

(10) Patent No.: US 6,795,481 B2
(45) Date of Patent: *Sep. 21, 2004

(54) NON-SPHERICAL WHISPERING-GALLERY-MODE MICROCAVITY

(75) Inventors: Lutfollah Maleki, Pasadena, CA (US); Xiaotian S. Yao, Diamond Bar, CA (US); Vladimir Ilchenko, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 173 days.

This patent is subject to a terminal disclaimer.

(21) Appl. No.: 09/816,872

(22) Filed: Mar. 22, 2001

(65) Prior Publication Data

US 2002/0018611 A1 Feb. 14, 2002

Related U.S. Application Data

(60) Provisional application No. 60/191,141, filed on Mar. 22, 2000.

(51) Int. Cl.[7] .............................. H01S 3/08; H01S 3/083
(52) U.S. Cl. ............................ 372/108; 372/92; 372/94
(58) Field of Search ............................ 372/92, 108, 67, 372/94, 66

(56) References Cited

U.S. PATENT DOCUMENTS

| | | | |
|---|---|---|---|
| 4,829,537 A | | 5/1989 | Baer |
| 5,343,490 A | * | 8/1994 | McCall ........................ 372/92 |
| 5,652,556 A | * | 7/1997 | Flory et al. .............. 333/219.1 |
| 5,742,633 A | * | 4/1998 | Stone et al. ................... 372/92 |
| 6,389,197 B1 | * | 5/2002 | Iltchenko et al. ............. 385/28 |
| 6,473,218 B1 | * | 10/2002 | Maleki et al. .............. 359/245 |
| 6,476,959 B2 | * | 11/2002 | Yao ............................ 359/334 |
| 6,487,233 B2 | * | 11/2002 | Maleki et al. .............. 372/108 |
| 6,490,039 B2 | * | 12/2002 | Maleki et al. .............. 356/108 |

OTHER PUBLICATIONS

Schiller et al. "High resolution spectroscopy of whispering gallery modes in large dielectric spheres" Optics Letters, vol. 16, No. 15, Aug. 1, 1991, pp 1138–1140.*

Wang et al. "A Whispering Gallery Mode Sapphire Resonator With Semi–Spherical Enclosure." *Microwave Symposium Digest 2000 IEEE MIT–S International* Jun. 16, 2000, vol. 2, pp. 1149–1152.

Griffel et al. "Fiber Coupling of DFB Laser to Micro Spherical Cavities—A Novel Approach for Frequency Control and Linewidth Quenching Utilizing Morphology Dependent Resonances." Lasers and Electro–optics Society Annual Meeting 1995, Oct. 31, 1995, vol. 1, pp. 296–297.

Little et al. "Analytic Theory of Coupling from Tapered Fibers and Half–Blocks into Microsphere Resonators." *Journal of Lightwave Technology* Apr. 4, 1999, vol. 17 (4), pp. 704–715.

Ilchenko, V.S. et al. "Microtorus: a high–finess microcavity with whispering–gallery modes." Optics Letters, vol. 26(5). Mar. 1, 2001.

* cited by examiner

*Primary Examiner*—Don Wong
*Assistant Examiner*—James Menefee
(74) *Attorney, Agent, or Firm*—Fish & Richardson P.C.

(57) ABSTRACT

Devices based on a non-spherical whispering-gallery-mode optical resonator.

39 Claims, 8 Drawing Sheets

NON-SPHERICAL WHISPERING-GALLERY-MODE MICROCAVITY

This application claims the benefit of U.S. Provisional Application No. 60/191,141, filed on Mar. 22, 2000.

ORIGIN

The systems and techniques described herein were made in the performance of work under a NASA contract, and are subject to the provisions of Public Law 96-517 (35 USC 202) in which the Contractor has elected to retain title.

BACKGROUND

This application relates to optical resonators, and more specifically, to optical whispering-gallery-mode resonators.

A dielectric sphere may be used to form an optical whispering-gallery-mode resonator which supports a special set of resonator modes known as "whispering gallery modes". These modes represent optical fields confined in an interior region close to the surface of the sphere around its equator due to the total internal reflection at the sphere boundary. Microspheres with diameters on the order of $10 \sim 10^2$ microns have been used to form compact optical resonators. Such resonators have a resonator dimension much larger than the wavelength of light so that the optical loss due to the finite curvature of the resonators can be small. The primary sources for optical loss include optical absorption in the dielectric material and optical scattering due to the inhomogeneity of the sphere (e.g., irregularities on the sphere surface). As a result, a high quality factor, Q, may be achieved in such resonators. Some microspheres with sub-millimeter dimensions have been demonstrated to exhibit very high quality factors for light waves, exceeding $10^9$ for quartz microspheres. Hence, optical energy, once coupled into a whispering gallery mode, can circulate at or near the sphere equator with a long photon life time.

Whispering-gallery-mode resonators may use resonator geometries based on spheres. Since the whispering gallery modes essentially exist near the equator of a sphere, a resonator may not be necessarily a whole sphere but a portion of the sphere near the equator that is sufficiently large to support the whispering gallery modes. Hence, rings, disks and other geometries formed from a proper section of a sphere may be used. Such resonators are still spherical and their whispering gallery modes are essentially identical to such modes of the respective whole spheres.

SUMMARY

This application includes non-spherical whispering-gallery-mode resonators and their applications. In one embodiment, a spheroidal cavity is used to generate a true finesse on the order of $10^4$, a free spectral range of the order of few nanometers, and a quality-factor $Q \sim 1 \times 10^7$. Devices based on such a spheroidal cavity are also disclosed.

DETAILED DESCRIPTION

Figure 1:
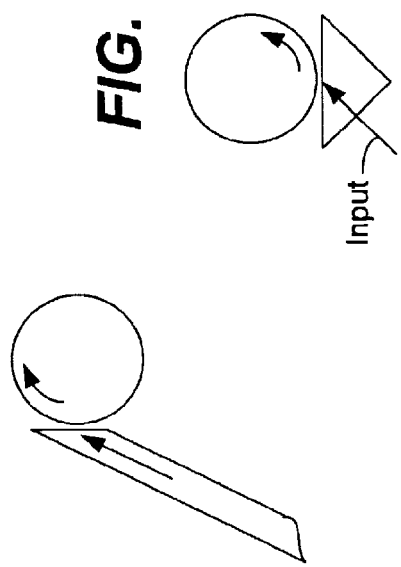
FIG. 1 shows one embodiment of a non-spherical microcavity.

The spheroidal microcavity geometry is designed in part based on recognition of fundamental characteristics and certain limitations of spherical microcavities formed from partial or whole spheres. The whispering-gallery modes are essentially closed circular waves trapped by total internal reflection inside an axially symmetric dielectric body. The very high quality factors Q of microspheres may be attributed to several factors. For example, dielectric materials for microspheres are selected to have ultra-low optical loss in at the frequencies of the supported whispering gallery modes. Fiber-grade fused silica may be used for resonators operating at wavelengths near 1.3 and 1.5 microns at which the optical loss is low. For another example, the surface of the sphere may be specially fabricated to minimize the size of any surface inhomogeneities, e.g., on the order of a few Angstroms by processes such as fire polishing. The high index contrast in microsphere cavities is also used for steep reduction of radiative and scattering losses with increasing radius. In addition, the two-dimensional curvature of a sphere provides for grazing reflection of all wave vector components. The grazing incidence in a sphere can be essential for minimizing surface scattering that would otherwise limit the Q far below that imposed by attenuation in the material. For example, in the integrated optical microring and micro-disk cavities based on planar waveguide technology, the light effectively bounces from flat surfaces under finite angles and their typical Q-factor is limited to $10^4 \sim 10^5$.

The substantially higher Q in spheres, as compared to micro-disks and micro-rings, comes at the price of a relatively dense spectrum of modes. In an ideal sphere with zero eccentricity, the optical spectrum of the sphere has TE(TM)$_{lmq}$ modes separated by a free spectral range (FSR) defined by the circumference of the sphere and related to consecutive values of the mode index l. The mode index l approximately represent the number of wavelengths that fit into the optical length of the equator, m the number of field maxima in the equator plane, and q the field maxima in the direction along the radius in the equator plane.

Each of TE(TM)$_{lmq}$ modes, however, is degenerate and includes (2l+1) modes given by the possible values of the mode index m. In actual spheres, the spherical surfaces are usually not perfectly spherical and have residual nonsphericity. This deviation from the perfect spherical surface lifts the mode degeneracy and breaks down each TE(TM)$_{lmq}$ mode with a given value for the mode index l into a series of observable TE(TM)$_{lmq}$ modes with different values in the mode index m under each value for the mode index l. Therefore, a nonideal spherical resonator exhibits two different FSRs, a "large" FSR which is the frequency spacing between two adjacent TE(TM)$_{lmq}$ modes with the same values for indices m and q but with a difference of 1 in their l values, and a "small" FSR which is the frequency spacing between two adjacent TE(TM)$_{lmq}$ modes with the same l values but with a difference of 1 in their m values:

"Small" FSR:

$$v_{lmq} - v_{l,m-1,q} \sim v\frac{\varepsilon^2}{2l}$$

"Large" FSR:

$$v_{lmq} - v_{l-1,mq} = \frac{c}{2\pi na}(t_{lq} - t_{l-1,q}) \sim v/l$$

In silica spheres of diameter 150 to 400 micron, for example, typical fabrication techniques usually produce an eccentricity of about $\varepsilon^2=3\times10^{-2}$. The "large" FSR may be in the range of 437 to 165 GHz, or in the wavelength scale, 3.5 to 1.3 nm near the center wavelength 1550 nm. The "small" FSR may be in the range of 6.8–2.5 GHz. As a result, the spheres are capable of producing a large FSR on the order of hundreds of GHz, the actual spectrum of such spheres are relatively dense with a useful FSR limited by the "small" FSR typically under 10 GHz.

The above relatively dense spectrum in a typical sphere resonator may limit applications of the resonator since it can complicate spectral analysis, cause a mode hop caused by frequency jittering of a laser when such a resonator is used as a frequency reference to lock a CW laser at a selected laser frequency. In addition, intermediate filtering may be needed to eliminate some of the modes to obtain a spectrum with well-separated resonance peaks.

Hence, one way to achieve a FSR on the order of hundreds of GHz in spherical resonators without external spectral filtering is to maintain the mode degeneracy so that the "large" FSR in the whisper gallery modes TE(TM)$_{lmq}$ for given values in the mode index l can be produced in the resonator's spectrum. Under this approach, the eccentricity of the sphere should be minimized. This, however, may be technically difficult due to practical limitations of the available fabrication technologies.

In recognition of the above, the microcavities in the present application are designed to use non-spherical resonator geometries that are axially symmetric. Such a non-spherical resonator retains the two-dimensional curvature confinement, low scattering loss, and very high Q typical of microspheres, and yet approaches spectral properties of the single-mode waveguide ring. In one embodiment, instead of minimizing the eccentricity, such a non-spherical resonator may be formed by distorting a sphere to a non-spherical geometry to purposely achieve a large eccentricity, e.g., greater than $10^{-1}$. The following describes an oblate spheroidal microcavity or microtorus as one example of such non-spherical microcavities.

FIG. 1 shows one embodiment of a spheriodal microcavity 100 formed of an optical dielectric material. The cavity 100 is formed by revolving an ellipse around a symmetric axis along the short elliptical axis 101. The lengths of the long and short elliptical axes are a and b, respectively. Hence, the eccentricity of cavity 100 is $\varepsilon^2$ $(1-b^2/a^2)$. Near the symmetry plane at the location of WG modes, toroidal surface of outer diameter D and cross-section diameter d coincides with that of the osculating oblate spheroid with large semiaxis a=D/2 and small semiaxis b=½$\sqrt{Dd}$. The dimension D of the spheroid 100 may be less than 10 mm for operations in the optical and microwave spectral ranges. The eccentricity may be greater than 0.5.

Figure 2A:
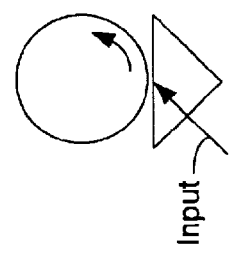
FIGS. 2A, 2B, and 2C show exemplary evanescent coupling configurations for the non-spherical microcavity in FIG. 1.
Figure 2B:
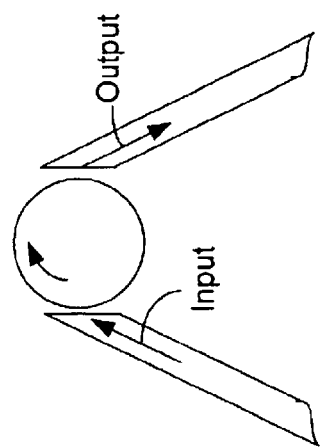
Figure 2C:
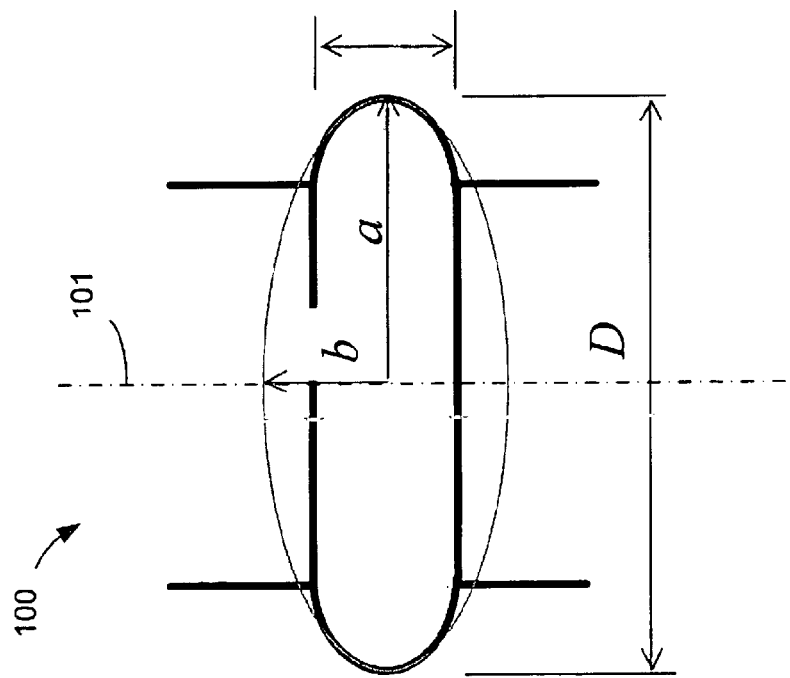

In operation, at least one optical coupling element may be positioned near the cavity 100 to evanescently couple an input beam into the cavity 100 in one or more whispering gallery modes. An optical fiber or a planner waveguide configured with an angle-polished facet may be used as this optical coupling element. A microprism may also be used to provide the proper evanescent coupling. FIGS. 2A and 2B show the above optical coupling mechanisms. FIG. 2C shows that, when two such optical coupling elements are used, one is to couple light into the cavity 100 and the other is to couple light out of the cavity 100.

Analysis of the spectrum of the dielectric spheroid 100 is not a trivial task, even numerically. In contrast to a sphere of a small eccentricity, analysis in highly-eccentric spheroids generally cannot be based on simple geometrical approximations. Unlike the case of cylindrical or spherical coordinates, orthogonal spheroidal vector harmonics that satisfy boundary conditions may not be derived via a single scalar wave function. Furthermore, the calculation of spheroidal angular and radial functions is also a nontrivial task.

The WG mode eigenfrequencies of the cavity 100 for a radius a much larger than the wavelength of the a WD mode may approximately represented as follows:

$$nk_{lmq}a \approx t_{lq} - \frac{\chi}{\sqrt{n^2-1}}, \quad (1)$$

where $t_{lq}$ is the q-th zero of the spherical Bessel function of the order l and $\chi=n$ for TE-mode and $\chi=1/n$ for TM-mode. For large l, $t_{lq}\sim l+O(l^{1/3})$, which may be calculated either directly or approximated via the zeroes of the Airy function. See, e.g., M. Abramowitz, I. A. Stegun, eds., Handbook on mathematical functions, New-York, Dover Publ. (1970).

The meaning of small second term on the right hand side of Eq. (1) may be understood by considering the following. First, a WG mode is quasiclassically a closed circular beam supported by the total internal reflection within the cavity 100. Secondly, the optical field tunnels outside of the cavity 100 at the depth $1/k\sqrt{n^2-1}$. Thirdly, the tangential component of E (TE-mode) or the normal component of E (TM-mode) at the surface of the cavity 100 is continuous at the boundary. Eigen frequencies of high-order WG modes (l>>1;l≈m) in dielectric spheres can be approximated via solutions of the scalar wave equation with zero boundary conditions, because most of the energy is concentrated in one component of the field ($E_\square$ for TE-mode and $E_r$ for TM-mode).

Based on above considerations, the WG mode eigenfrequencies can be estimated for the oblate spheroid 100 of large semiaxis a, small semiaxis b, and eccentricity $\varepsilon=\sqrt{1-b^2/a^2}$. Since WG modes are localized in the "equatorial" plane, the radial distribution may be approximated by cylindrical Bessel function $J_m(n\tilde{k}_{mq}r)$ with $n\tilde{k}_{mq}a=na\sqrt{k_{lmq}^2-k_\perp^2}\approx T_{mq}$, where $J_m(T_{mq})=0$ and $k_\perp$ is the wavenumber for quasiclassical solution for angular spheroidal functions and can approximately written as:

$$k_\perp^2 \approx \frac{2(l-m)+1}{a^2\sqrt{1-\varepsilon^2}}m.$$

more rigorous considerations can follow the approach given in I. V. Komarov, L. I. Ponomarev, S. Yu. Slavyanov, Spheroidal and Coulomb Spheroidal Functions, Moscow, Nauka (1976). Taking into the account that $T_{mq} \approx t_{1q}-(l-m+½)$, the following approximation can be derived:

$$nk_{lmq}a - \frac{\chi}{\sqrt{n^2-1}} \approx na\sqrt{\tilde{k}_{mq}^2 + k_\perp^2} \qquad (2)$$

$$\approx T_{mq} + \frac{k_\perp^2 a^2}{2T_{mq}}$$

$$\approx t_{lq} + \frac{2(l-m)+1}{2}\left(\frac{1}{\sqrt{1-\varepsilon^2}} - 1\right)$$

For very small $\epsilon$, Eq. (2) yields the same value for "small" FSR (frequency splitting between modes with successive m≈l). See, e.g., H. M. Lai, P. T. Leung, K. Young, P. W. Barber, S. C. Hill, Phys. Rev. A 41, 5187–5198 (1990).

The results of the approximation in Eq. (2) for l=100 may be compared to numerically calculated zeroes of the radial spheroidal functions. Even with a large eccentricity of $\epsilon$=0.8, the deviation is no more than 5% in the estimate of m, m+1 mode splitting and 0.1% in the absolute mode frequencies. For larger l and smaller $\epsilon$, the error should evidently be smaller. As follows from Eq. (2), with increasing eccentricity $\epsilon$, "small" FSR—frequency interval between modes with successive m—becomes compatible in magnitude with the "large" FSR:

$$(k_{l+lmq} - k_{lmq}) \sim (k_{lm+lq} - k_{lmq}) \sim k_{lmq}/l.$$

In addition, excitation conditions for modes with different m become more selective: e.g. optimal angles for prism coupling vary with $\epsilon$ as $$\frac{k_\perp}{k_{lmq}} \propto (1-\varepsilon^2)^{-1/4}.$$

Figure 3:
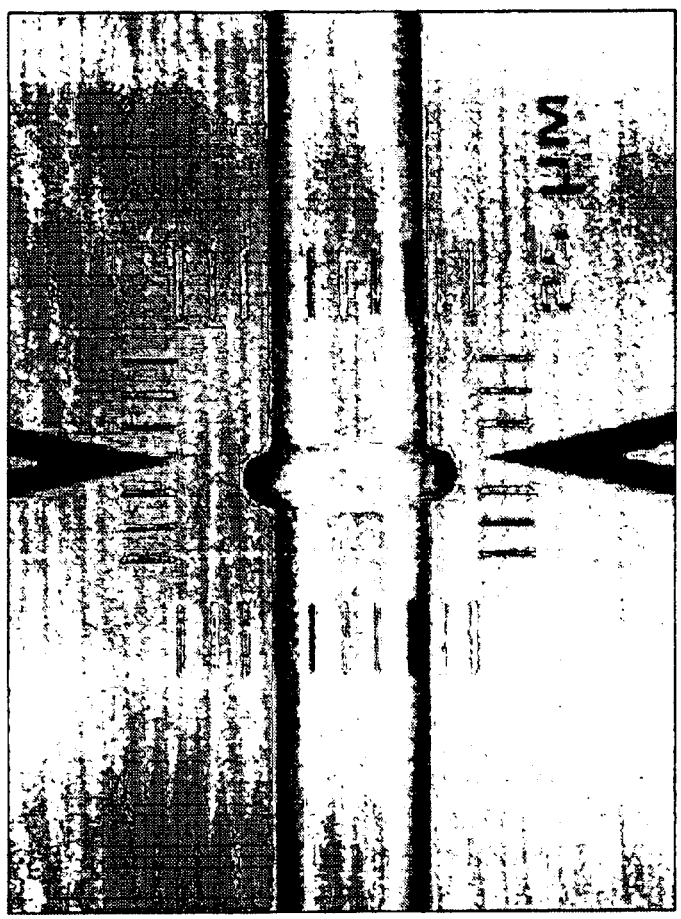
FIG. 3 shows a photograph of a spheroidal cavity by compressing a small sphere of low-melting silica glass between cleaved fiber tips based on the design in FIG. 1 with $D=2a=165$ μm; $d=42$ μm; and $2b=83$ μm.

FIG. 3 shows a photograph of a spheroidal (microtorus) cavity formed by compressing a small sphere of low-melting silica glass between cleaved fiber tips. The combined action of surface tension and axial compression resulted in the desired spheroidal geometry. One of the fiber stems is then cut and the whole structure is installed next to a prism coupler for evanescent coupling as shown in FIG. 2B for measurements.

Figure 4:
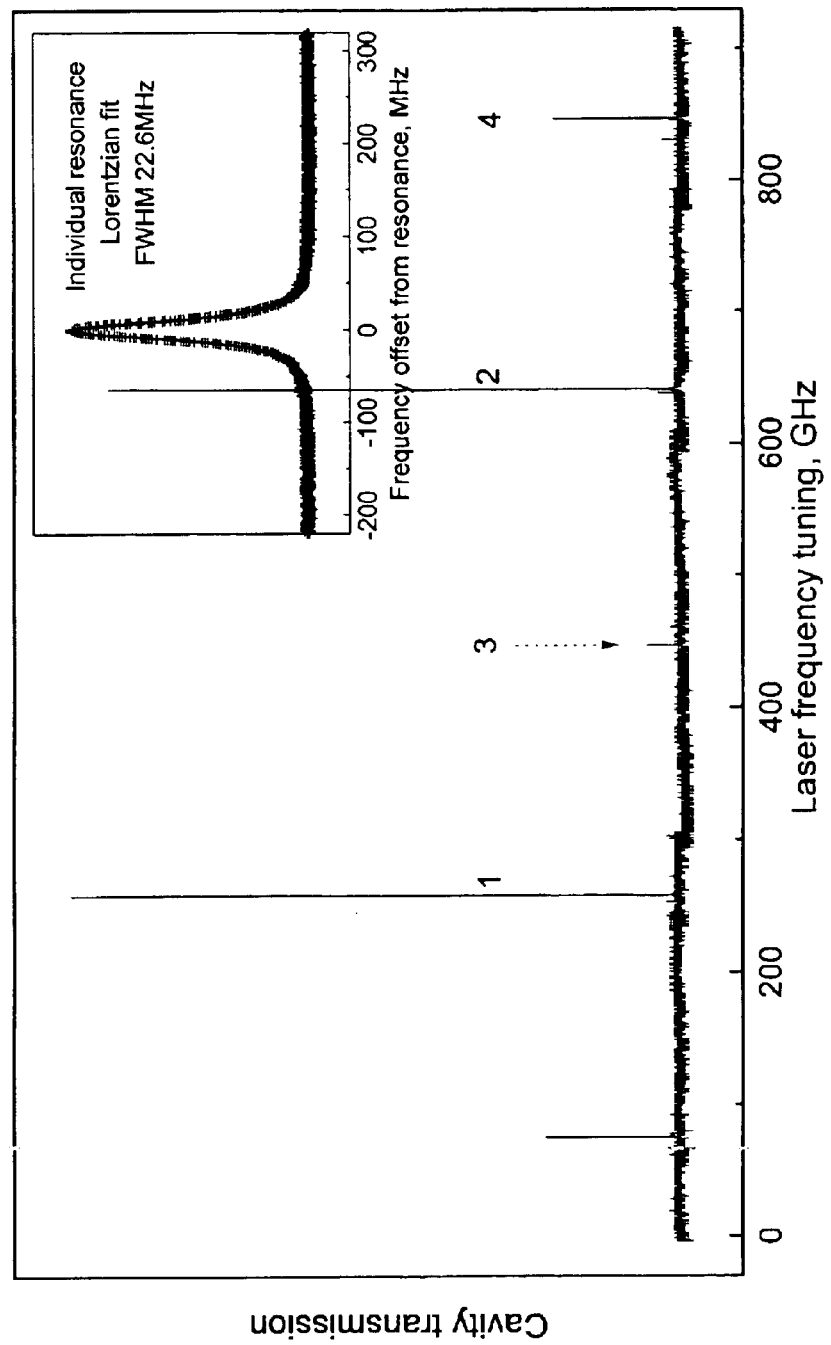
FIG. 4 shows the measured TE WG mode spectrum of the cavity shown in FIG. 2 by using a tunable DFB laser near the wavelength of 1550 nm Free spectral range.

FIG. 4 shows the measured WG mode spectrum by using a tunable DFB laser near the wavelength of 1550 nm. The laser was continuously frequency-scannable within the range of ~80 GHz by modulating the current, and from 1545.1 to 1552.4 nm by changing the laser temperature. The spectrum with a spectral range of 900 GHz was compiled from 15 individual scans with 60 GHz increments obtained by changing the temperature. The frequency reference for "stitching" the spectral fragments was obtained by recording the fringes of a high-finesse (F~120) Fabry-Perot ethalon (FSR=30 GHz) and additional frequency marks provided by 3.75 GHz amplitude modulation. The total drift of the FP was less than 400 MHz over the full 15-minute measurement time. The spectrum is reduced to only two whispering-gallery modes of selected polarization excited within the "large" free spectral range of the cavity FSR=383 GHz, or 3.06 nm in the wavelength domain. The transmission of "parasitic" modes is at least 6 dB smaller than that of the principal ones. With individual mode bandwidth of 23 MHz, the finesse F=1.7×10$^4$ and Q=8.5×10$^6$ are therefore demonstrated with this micro-resonator.

The above measured result is comparable to the predictions of the approximate expression in Eq. (2). For a =82.5 $\mu$m, b=42.5 $\mu$m, the eccentricity is $\epsilon$=0.86. The refraction index of the dielectric material is n=1.453. The principal mode number for TE-modes at the wavelength 1550 nm should be l≈473. The "large" FSR is $$v_{lmq} - v_{l-1,mq} = \frac{c}{2\pi na}(t_{lq} - t_{l-1,q})$$
$$= \frac{c}{2\pi na}(1 + 0.617l^{-2/3} + O(l^{-5/3})) \approx 402\text{GHz}$$

and the "small" FSR is $$v_{lmq} - v_{l,m-1,q} = \frac{c}{2\pi na}\left(\frac{1}{\sqrt{1-\varepsilon^2}} - 1\right) \approx 382\text{GHz}.$$

In the measured spectrum, the frequency separation between the largest peaks 1 and 2 in FIG. 4 is equal to 383.7±0.5 GHz. It may therefore be attributed as corresponding to the small FSR, in good agreement with the above estimate, if we take into account an approximately 2% uncertainty in the measurement (limited mainly by the precision of geometrical evaluation of cavity dimensions). The separation between the peaks 3 and 4 in FIG. 4, is equal to 400.3±0.5 GHz, which is close to the estimate value of the "large" free spectral range.

It may be argued that despite the large splitting between the modes with adjacent values of index m (of the order of "large" FSR), one may still expect a dense spectrum resulting from the overlap of many mode families with different principal number l. In practice, however, it is exactly the coincidence in the frequency domain of WG modes with different main index l, and rapidly increasing difference l−m, that should be responsible for effective dephasing of the "idle" modes from the evanescent coupler, resulting in the reduction of modes in the observed spectrum. In addition to increasing phase mismatch for excitation of WG modes with complex "transverse" structure (l −m>l), reduced amplitude of these modes may also be the result of their lower intrinsic quality-factor. With smaller unloaded Q, critical coupling for these modes would require closer position of the cavity to the excitation prism or waveguide.

The above examples and analysis indicate that a spheroidal microcavity can be designed to achieve a substantial reduction (up to 2 orders of magnitude) in the number of excited WG modes in highly oblate spheroids compared to typical microspheres. This reduction in the mode density can be obtained without sacrificing the high Q associated with these structures. The novel type of optical microcavity demonstrates a true finesse on the order of 10$^4$, a free spectral range of the order of few nanometers, and a quality-factor Q~1×10$^7$. It is contemplated that a complete elimination of "transverse" WG modes may be expected in spheroidal cavities of higher eccentricity. Further increase of the Q and the finesse may also be expected with a refinement of the fabrication technique. The decrease in the density of mode spectrum of ultra-high-Q microcavities offers new applications in laser stabilization, microlasers, various passive photonics devices, and in fundamental physics experiments.

Figure 5A:
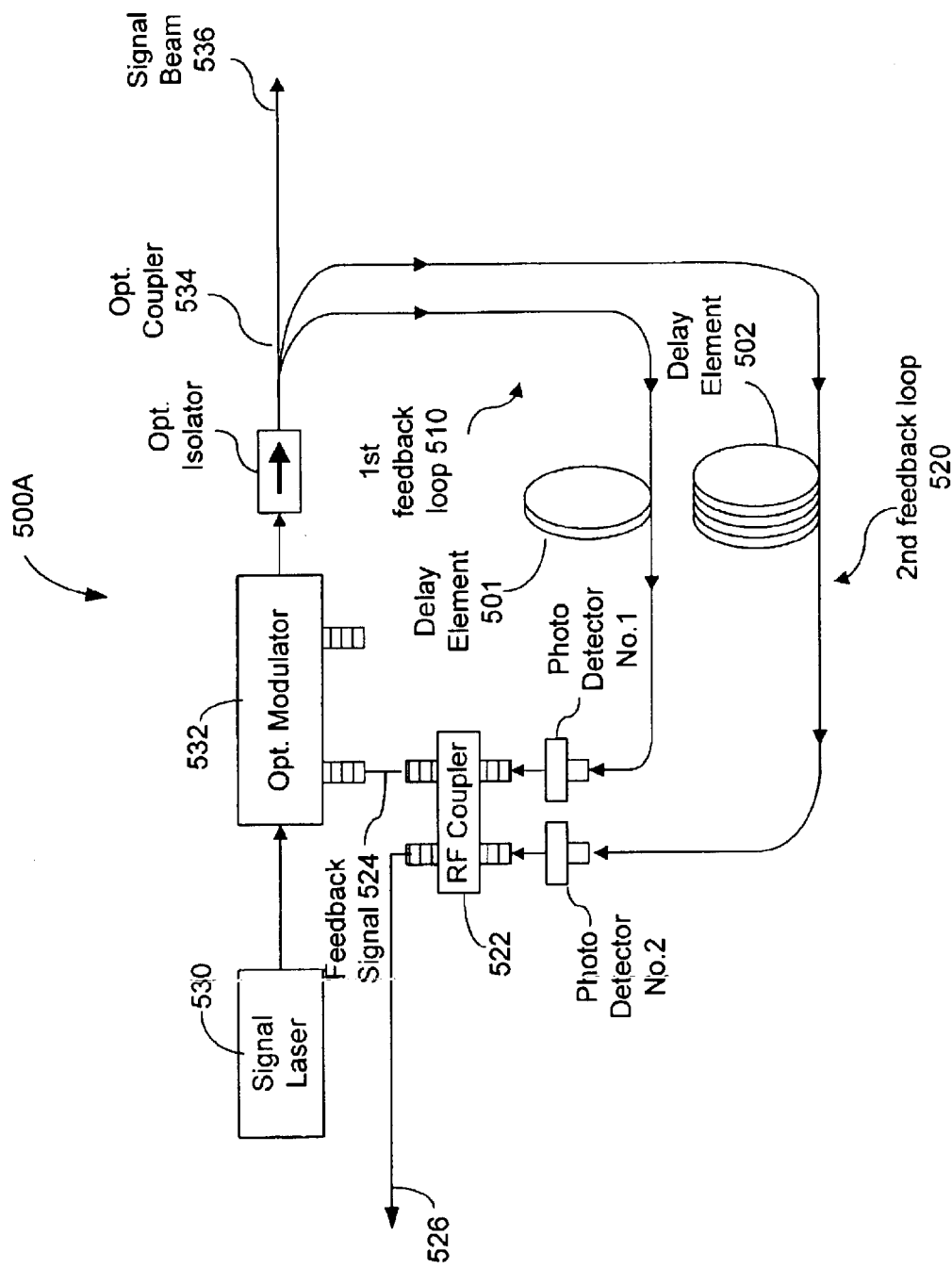
FIGS. 5A, 5B, and 5C show embodiments of optoelectronic oscillators using a spheroidal cavity as an optical delay element in a feedback loop.
Figure 5B:
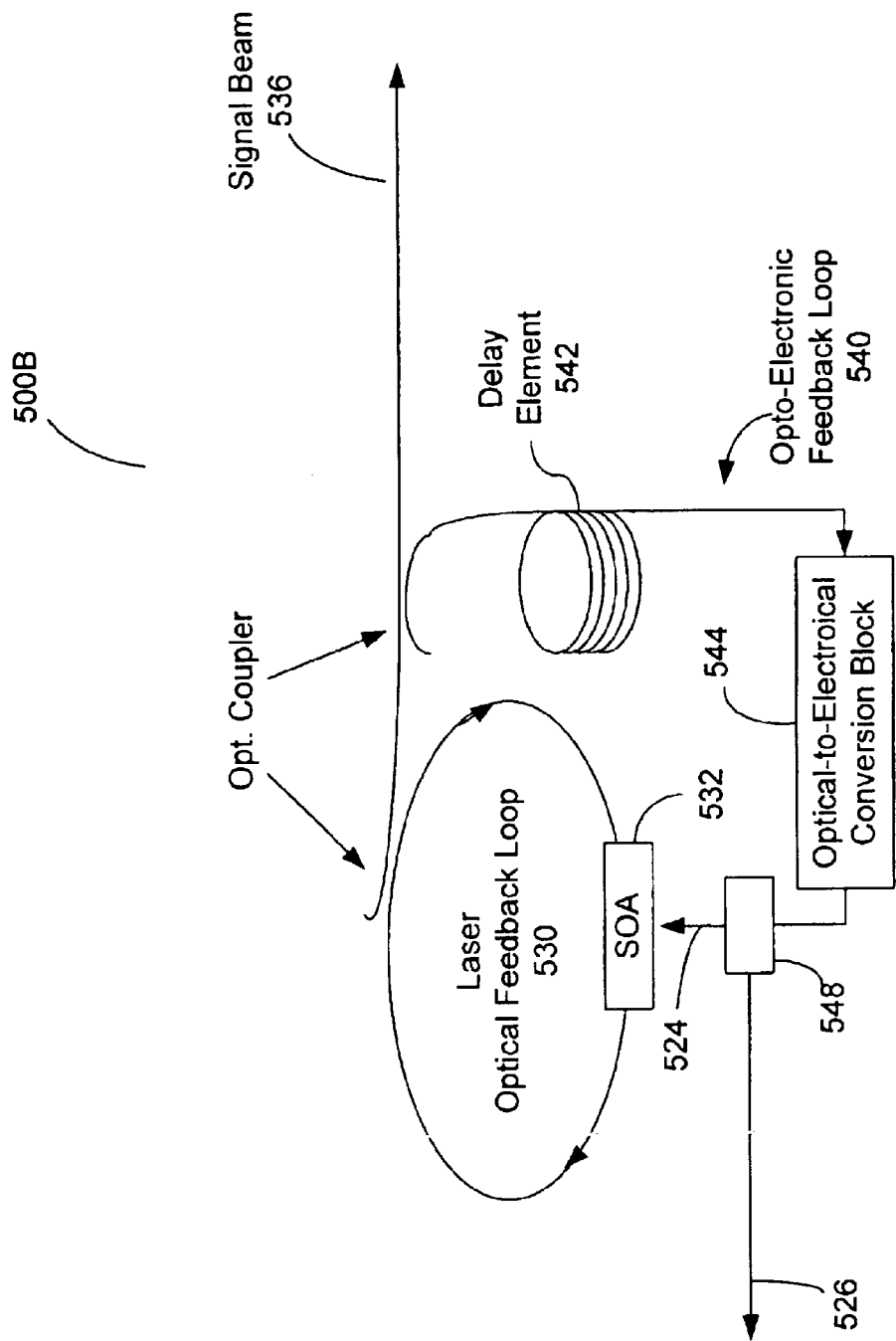
Figure 5C:
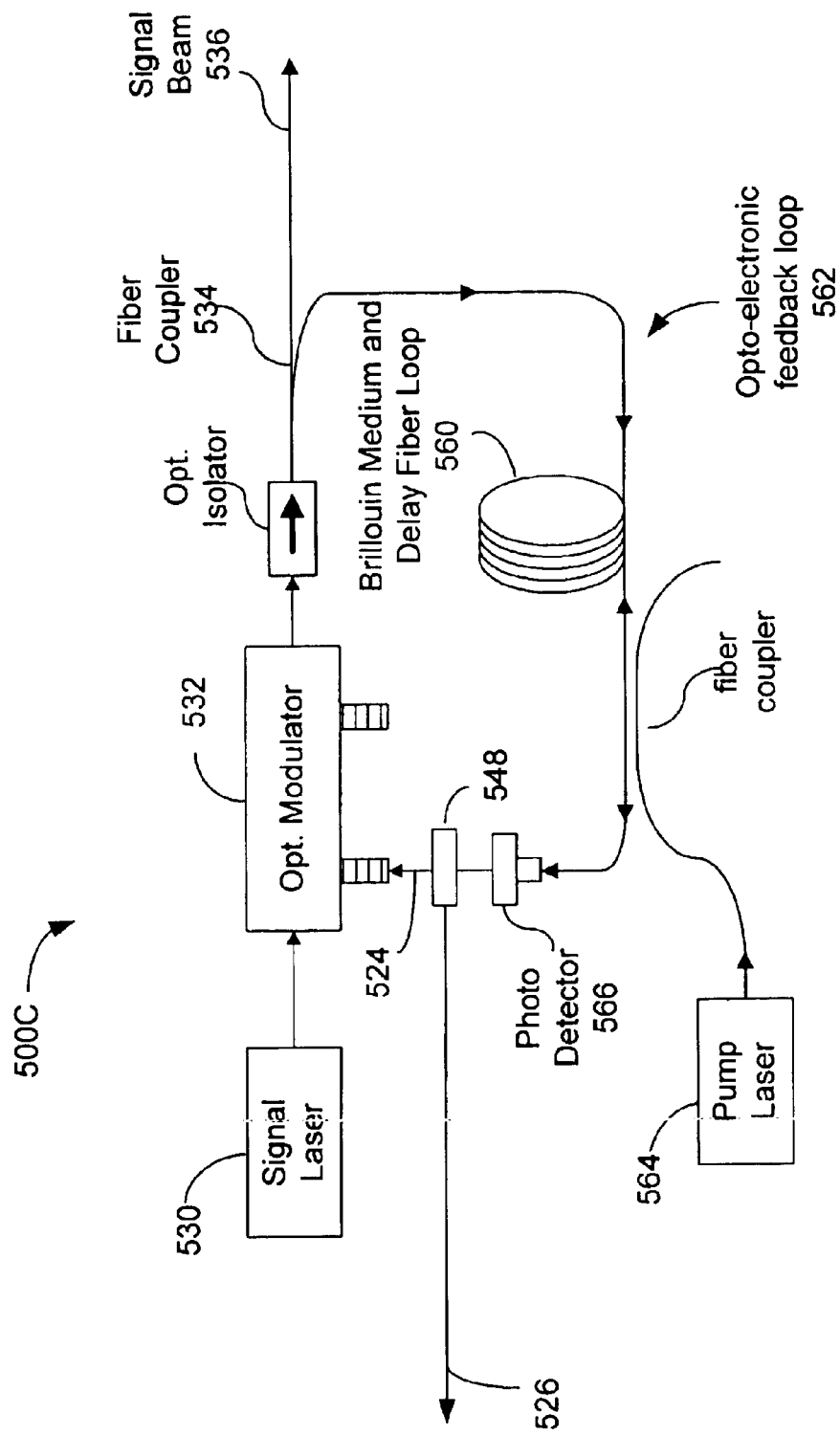

FIGS. 5A, 52, and 5C show exemplary opto-electronic oscillators that use a spheroidal microcavity as an optical delay element. Compared to previously disclosed opto-electronic oscillators with microspheres operating in the microwave band (typical frequencies ~3–30 GHz), the OEO based on micro-spheroidal (microtorus) resonator may operate robustly at much higher frequencies, corresponding to their mode spacing (FSR, free spectral range) in the sub-millimeter wave band (>300 GHz) and further, in Terahertz frequency domain(>1000 GHz). Such an OEO may include an electrically controllable optical modulator 532 and at least one active opto-electronic feedback loop that comprises an optical part and an electrical part interconnected by a photodetector. Although many commercial electro-optical modulators cannot operate beyond 100 GHz, such an ultra-high frequency optical modulator may be constructed on the basis of spheroidal resonator formed of electro-optic material as described later in this application. The modulator for the OEO needs not be operated in a wide range of frequencies, therefore high efficiency can be achieved by using double microwave and optical resonance. The opto-electronic feedback loop receives the modulated optical output from the modulator 532 and converted it into an electrical signal 524 to control the modulator 532. The loop produces a desired delay and feeds the electrical signal in phase to the modulator 532 to generate and sustain both optical modulation and electrical oscillation in the RF range when the total loop gain of the active opto-electronic loop and any other additional feedback loops exceeds the total loss.

The OEOs implement a CW signal laser 530 to produce a signal beam at an optical carrier frequency which may be tunable. The signal optical modulator 532 modulates the signal beam to produce the signal 536. The signal optical modulator 532 may be an amplitude modulator or a phase modulator. The phase modulator may be preferred in some applications because it is relatively simple to operate and can be designed to have low optical loss and operate without bias.

OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Some examples of OEOs are disclosed in U.S. Pat. Nos. 5,723,856, 5,777,778, 5,917,179, and 5,929,430, and U.S. patent application Ser. No. 09/491,988 filed January 2000.

FIG. 5A shows a dual-loop OEO 500A in which an optical delay element 501 or 502 such as a fiber loop or the above optical spheroidal resonator is included in each opto-electronic feedback loop 510 or 520. Alternatively, one of the feedback loops may be replaced with an electrical feedback loop. A RF coupler may be used to split a portion of the RF feedback signal 524 to produce an output RF signal 526. One feedback loop may be removed to form a single-loop OEO.

FIG. 5B shows a coupled OEO which directly couples a laser oscillation in an optical feedback loop 530 to an electrical oscillation in an opto-electronic feedback loop 540 which includes an optical portion with an optical delay element 542 and an electrical portion that includes an optical-to-electrical conversion block 544 (e.g., a photodetector). The optical gain of the optical feedback loop 530 is controllable by an electrical signal 524 from the opto-electronic loop 540, e.g., a semiconductor optical amplifier (SOA) 532 may be disposed in the optical loop 530. Here, the optical feedback loop 530 and the SOA 532 function as the signal laser and the signal modulator 532 in FIG. 5A. A RF coupler 548 may be used to split a portion of the signal 524 as the output RF signal 526.

In addition, opto-electronic oscillators can also be implemented by having at least one active opto-electronic feedback loop that generates an electrical modulation signal based on the stimulated Brillouin scattering. FIG. 5C shows such a Brillouin OEO which includes a Brillouin optical medium 560 in an opto-electronic feedback loop 562 and uses the natural narrow linewidth of the Brillouin scattering to select a single oscillating mode. A pump laser 564 is used to generate a Brillouin pump beam in the Brillouin medium 560. A photodetector 566 converts the optical signal in the loop 562 into an electrical feedback signal equivalent to the RF signal 108. A RF coupler 548 may be used to split a portion of the detector output as the output RF signal 526.

The above spheroidal resonator operates to store optical energy only in certain whispering gallery modes. When the optical feedback caused by a round trip around the cavity has a phase delay of N2π (N=1, 2, 3, . . . ), the optical resonator operates in a resonance and optical energy accumulates inside the resonator with a minimum loss. When the optical energy is coupled out at this resonance condition, the output is maximized. However, when the optical feedback has a phase delay other then N2π, the amount of optical energy accumulated in the resonator reduces from its maximum value and, accordingly, the coupled output is also reduced from its maximum value. Thus, the resonator can be modulated to produce a modulation on the output. The modulation on the phase delay is not limited to the phase difference between a resonance condition and a non-resonance condition and can be between any two different values in the phase delay. In fact, the phase delay may be biased at a value where a change in the phase delay produces the maximum change in the output energy.

The dielectric material in the spheroidal resonator may be formed of an electro-optic material so that an external electrical signal can be used to change the refractive index of the resonator to change the whispering-gallery mode condition and hence the output coupling. Such an optical modulator can be designed to operate at a low operating voltage on the millivolt level, to achieve a high modulation speed at hundreds of gigahertz or higher, and have a compact package. The optical coupling with the resonator may be implemented with waveguides or fibers for integration with other fiber optical elements or integrated electro-optical circuits formed on substrates. Hence, such optical modulators may be used in a variety of applications having optical modulation, including optical communication and optical signal processing.

Under proper configurations, either the spheroidal resonator alone or the spheroidal resonator in connection with a proper electrical strip line can form an electrical resonator to support electrical energy in the same whispering gallery modes with proper phase matching conditions. Hence, electrical and optical waves can coexist and co-propagate in certain whispering gallery modes. When the sphere is formed of an electro-optic material, the electrical wave can be used to alter or modulate the dielectric constant of the sphere and hence modulate the light based on the electro-optic effects.

It is further contemplated that, the spheroidal cavity may be formed of a laser-active material with active ions such as rare earth ions to operate as a miniature solid-state laser when a proper optical pumping scheme is provided. The laser active material can produce an optical gain at a laser emission wavelength by absorbing pump light at a pump wavelength longer than the laser emission wavelength. Because of the small volume and high Q of whispering-gallery modes, such a laser can combine very low threshold and narrow emission linewidth. For example, the angle-polished fiber coupler shown in FIG. 2A may be used to couple a pump beam into the spheroidal cavity and to couple the laser beam out of the cavity, both through evanescent fields of the whispering gallery modes.

In particular, the pump beam need be coupled into a pump WG mode and the laser beam is generated within the cavity in a laser WG mode. Therefore, the angle of the end facet of the fiber coupler is selected to match the mode matching conditions for both the pump and the laser beams. First, the fiber coupler matches the mode of the pump light guided by the fiber to a pump whispering gallery mode at the pump wavelength in the cavity. Secondly, the fiber coupler matches at least one laser whispering gallery mode at the laser wavelength to a guided mode at the laser wavelength in the fiber so that the output laser beam can be transmitted in the fiber. Both the laser whispering gallery mode and the pump whispering gallery mode spatially overlap in the cavity 130 to promote efficient energy conversion from the pump wavelength to the laser wavelength.

Figure 6A:
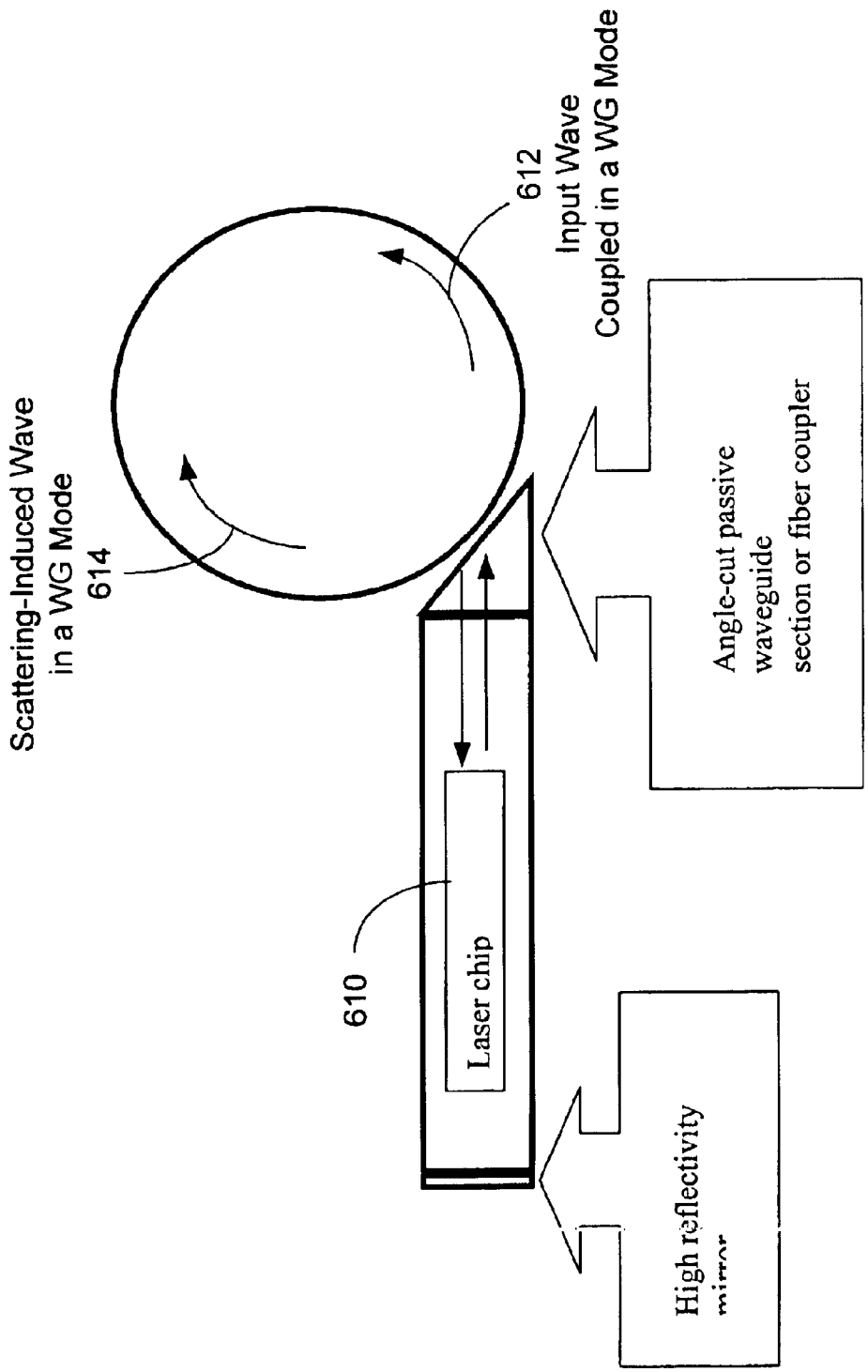
FIGS. 6A and 6B show two stabilized lasers based on frequency locking using a spheroidal cavity.
Figure 6B:
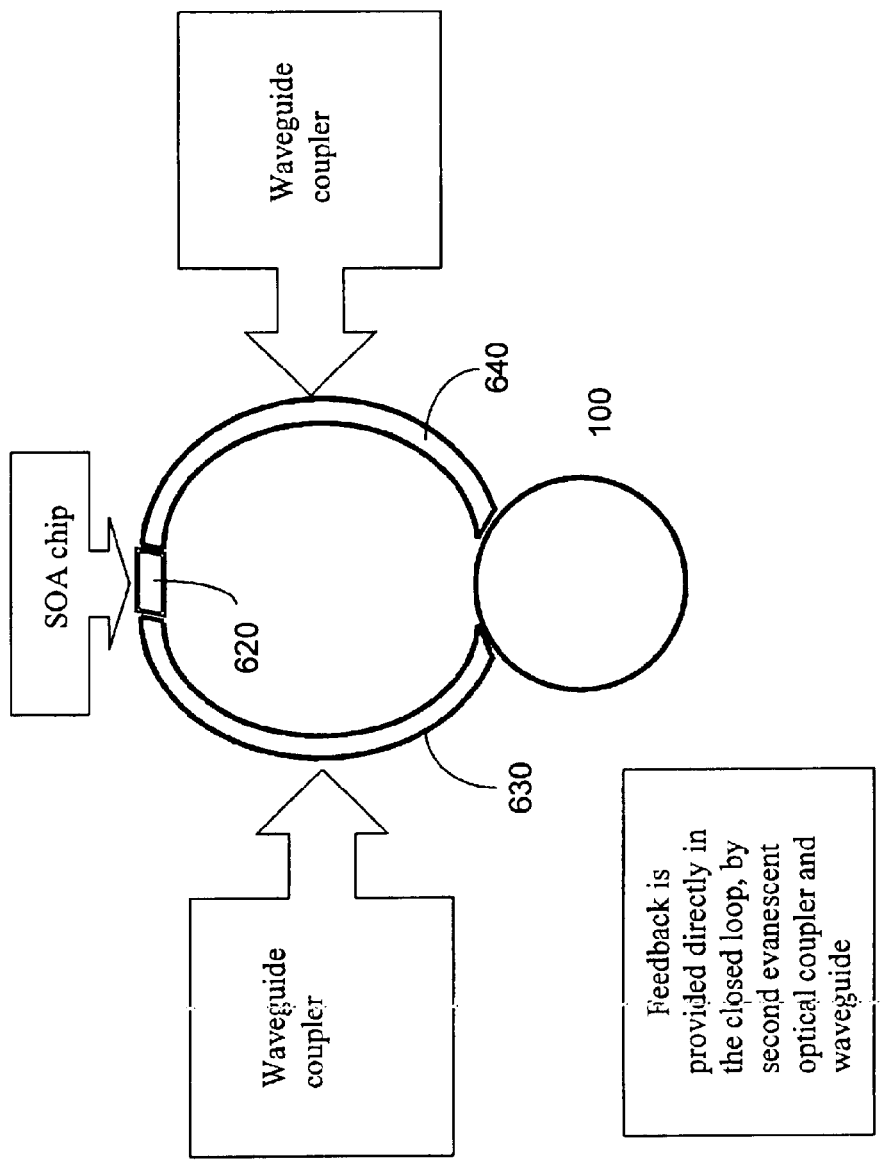

The above spheroidal (microtorus) resonators may also used to stabilize the frequency and narrow the emission linewidth of cw semiconductor diode lasers to take the advantage of the well-separated and clean resonance peaks of the WD modes. FIGS. 6A and 6B show two examples. Because of very high Q of modes ($\sim 10^8$ instead of $\sim 10^2$ in diode laser cavity itself), frequency fluctuations in such a coupled system can be suppressed by many order of magnitudes allowing creation of an ultracompact laser source with sub-kHz linewidth. This linewidth was previously achievable in larger-size cavity solid state lasers or complex stabilized systems based on external Fabry-Perot resonators.

This spherical microcavity was previously used in a system to stabilize a diode laser in an extra-cavity configuration. VASSILIEV VV, VELICHANSKY VL, ILCHENKO VS, GORODETSKY ML, HOLLBERG L, YAROVISTKY AV, Narrow-line-width diode laser with a high-Q microsphere resonator, OPT COMMUN 158: (1–6) 305–312 DEC 15 1998. That system, however, suffered from the excessive density of WG modes many of which (~100) were inside the gain bandwidth of laser diode (~several nanometers) so that intermediate mode selectors had to be used to suppress instabilities. With spheroidal microcavities configured to have their FSR in few nanometer domain, very simple configurations can be used as only one WG mode will find itself in the gain maximum of the semiconductor laser.

FIG. 6A depicts the embodiment of stabilized laser based on optical feedback provided by intracavity backscattering effect. The output of the laser 610 is evanescently coupled into the cavity 100 as a wave 612 in a WG mode. The scattering of the wave 612 produces a counter-propagating wave 614 in a WG mode. The wave 614 is then coupled to control the frequency of the laser 610. In FIG. 6B, a laser is formed by a closed optical that includes a semiconductor optical amplifier chip 620 (in effect, a laser diode with its internal cavity totally suppressed by antireflection coating), two passive waveguide or fiber couplers 630 and 640, and a microspheroidal cavity 100. The frequency of the laser is locked at a WG mode of the cavity 100.

Although the present disclosure only includes a few embodiments, it is understood that various modifications and enhancements may be made without departing from the following claims.

What is claimed is:

1. A device comprising a whispering-gallery-mode resonator formed of a spheroid made of an optical dielectric material and shaped with an eccentricity sufficiently large so that free spectral ranges of two different sets of whispering-gallery modes circulating along an equator in a circular cross section of said spheroid and around a short ellipsoid axis of said spheroid are compatible in magnitude.

2. The device as in claim 1, wherein said eccentricity is greater than 0.5.

3. The device as in claim 1, further comprising an optical coupling element disposed adjacent to said equator to evanescently couple optical energy into said resonator in at least one of said whispering-gallery modes, or out of said resonator from at least one of said whispering-gallery modes.

4. The device as in claim 3, wherein said optical coupling element includes a fiber tip with an angle-polished end facet to couple said optical energy.

5. The device as in claim 3, wherein said optical coupling element includes an optical planar waveguide with an angle-polished end facet to couple said optical energy.

6. The device as in claim 3, wherein said optical coupling element includes a prism.

7. The device as in claim 1, wherein said dielectric material is doped with active ions to produce optical gain at a laser emission wavelength by absorbing pump light at a pump wavelength shorter than said laser emission wavelength.

8. The device as in claim 1, wherein said dielectric material is an electro-optic material, and further comprising electrodes positioned to apply an electrical control voltage to said spheroid to modulate optical energy in said resonator.

9. The device as in claim 1, wherein said spheroid has a dimension less than 10 mm.

10. The devices as in claim 1, wherein said optical dielectric material includes a silica glass.

11. A method, comprising:

providing a whispering-gallery-mode resonator formed of a spheroid made of an optical dielectric material; and shaping the spheroid to produce a sufficiently large eccentricity so that free spectral ranges of two different sets of whispering-gallery modes circulating along an equator in a circular cross section of said spheroid and around a short ellipsoid axis of said spheroid are compatible in magnitude.

12. The method as in claim 11, further comprising coupling optical energy into said resonator in at least one of said whispering-gallery modes.

13. The method as in claim 11, further comprising:

coupling an output laser beam from a CW laser into said resonator in at least one of said whispering-gallery modes;

coupling optical energy out of said resonator from at least one of said whispering-gallery modes to produce a feedback signal; and feeding said feedback signal back to said laser to control a laser frequency.

14. The method as in claim 11, further comprising using said resonator to filter an optical beam to produce a filtered optical beam in a frequency of one of said whispering-gallery modes.

15. The method as in claim 11, further comprising:

using an optical modulator to modulate a cw laser beam in response to an electrical control signal;

coupling a portion of said modulated laser beam into said resonator in at least one of said whispering-gallery modes;

converting an optical output from said resonator into an electrical signal; and using at least a portion of said electrical signal as said electrical control signal to control said optical modulator.

16. A device, comprising:

a cw laser operable to produce a laser beam at a laser frequency;

a whispering-gallery-mode resonator formed of a spheroid made of an optical dielectric material and shaped with an eccentricity sufficiently large so that free spectral ranges of two different sets of whispering-gallery modes circulating along an equator in a circular cross section of said spheroid and around a short ellipsoid axis of said spheroid are compatible in magnitude; and a coupling element disposed adjacent to said resonator to evanescently couple said laser beam in optical energy into said resonator in at least one of said whispering-gallery modes and a feedback optical signal out of said resonator from at least one of said whispering-gallery modes into said laser to control said laser frequency.

17. The device as in claim 16, wherein said laser includes a diode laser.

18. A device, comprising:

an optical modulator operable to respond to an electrical control signal to modulate an input optical beam to produce a modulated signal;

a whispering-gallery-mode resonator formed of a spheroid made of an optical dielectric material and shaped with an eccentricity sufficiently large so that free spectral ranges of two different sets of whispering-gallery modes circulating along an equator in a circular cross section of said spheroid and around a short ellipsoid axis of said spheroid are compatible in magnitude; and a coupling element disposed adjacent to said resonator to evanescently couple a portion of said modulated signal into said resonator in at least one of said whispering-gallery modes; and a photodetector coupled to receive an optical output from said resonator to produce said electrical control signal.

19. The device as in claim 18, wherein said optical modulator includes:

a whispering-gallery-mode resonator formed of a spheroid made of an electro-optic material to receive said input optical beam; and electrodes positioned to apply said electrical control signal to said spheroid to modulate optical energy in said resonator to produce said modulated signal.

20. A device comprising an optical resonator formed of an optical dielectric material and including a region to support different set of whispering-gallery modes, wherein said region of said optical resonator has a circular cross section around which the whispering-gallery modes circulate and a shape that is not part of a sphere to be spatially more restrictive than a spherical surface to the whispering-gallery modes in a direction perpendicular to the circular cross section.

21. The device as in claim 20, further comprising an optical coupling element disposed adjacent to said optical resonator to evanescently couple optical energy into said nonspherical cavity in at least one of said whispering-gallery modes, or out of said optical resonator from at least one of said whispering-gallery modes.

22. The device as in claim 21, wherein said optical coupling element includes a fiber tip with an angle-polished end facet to couple said optical energy.

23. The device as in claim 21, wherein said optical coupling element includes an optical planar waveguide with an angle-polished end facet to couple said optical energy.

24. The device as in claim 21, wherein said optical coupling element includes a prism.

25. The device as in claim 20, wherein said optical dielectric material is doped with active ions to produce optical gain at a laser emission wavelength by absorbing pump light at a pump wavelength shorter than said laser emission wavelength.

26. The device as in claim 20, wherein said optical dielectric material is an electro-optic material, and the device further comprising electrodes positioned to apply an electrical control voltage to said optical resonator to modulate optical energy therein.

27. A device, comprising:

an electro-optic modulator to respond to an electrical control signal to modulate an input optical beam to produce a modulated signal, said modulator comprising:

a whispering-gallery-mode resonator formed of a spheroid made of an electro-optic material to receive said input optical beam, wherein said modulator is shaped with an eccentricity sufficiently large so that free spectral ranges of two different sets of whispering-gallery modes circulating along an equator in a circular cross section of said spheroid and around a short ellipsoid axis of said spheroid are compatible in magnitude, and electrodes positioned to apply said electrical control voltage to said spheroid to modulate optical energy in said resonator to produce said modulated signal;

a coupling element disposed adjacent to said resonator to evanescently couple a portion of said modulated signal into said resonator in at least one of said whispering-gallery modes;

an optical delay element to receive at least a portion of said modulated signal from said resonator to cause a delay in said portion of said modulated signal;

a photodetector coupled to receive said portion of said modulated signal from said optical delay element to produce said electrical control signal.

28. The device as in claim 27, wherein said optical coupling element comprises a fiber tip with an angle-polished end facet.

29. The device as in claim 27, wherein said optical coupling element comprises an optical planar waveguide with an angle-polished end facet.

30. The device as in claim 27, wherein said optical coupling element comprises a prism.

31. The device as in claim 27, wherein said optical delay element comprises a fiber loop.

32. The device as in claim 27, wherein said optical delay element comprises an optical resonator.

33. A device, comprising:

a semiconductor optical amplifier to produce an optical gain for input light at a laser wavelength to produce amplified output light;

a first waveguide coupler to direct said input light into said semiconductor optical amplifier;

a second waveguide coupler to receive said amplified output light from said semiconductor optical amplifier, and a whispering-gallery-mode resonator optically coupled between said first and said second waveguide couplers to receive said amplified output light and to output light as said input light to said first waveguide coupler, said resonator formed of a spheroid and shaped with an eccentricity sufficiently large so that free spectral ranges of two different sets of whispering-gallery modes circulating along an equator in a circular cross section of said spheroid and around a short ellipsoid axis of said spheroid are compatible in magnitude.

34. A device, comprising:
- a whispering-gallery-mode resonator in a shape of a spheroid having an equator in a circular cross section of said spheroid that is perpendicular to a short ellipsoid axis of said spheroid; and
- an optical coupler to couple light: into said resonator in a whispering gallery mode that circulates around said equator.

35. The device as in claim 34, wherein said resonator comprises active ions to produce optical gain at a laser emission wavelength by absorbing pump light at a pump wavelength shorter than said laser emission wavelength.

36. The device as in claim 34, wherein said resonator comprises an electro-optic material, and the device further comprising electrodes positioned to apply an electrical control voltage to said resonator to modulate optical energy in said resonator.

37. The device as in claim 34, wherein said optical coupler comprises an optical planar waveguide with an angle-polished end facet.

38. The device as in claim 34, wherein said optical coupler comprises a prism.

39. The device as in claim 34, wherein said optical coupler comprises a fiber tip with an angle-polished end facet.

* * * * *